United States Patent
Yamamoto et al.

(10) Patent No.: US 6,397,935 B1
(45) Date of Patent: *Jun. 4, 2002

(54) FLAT TYPE HEAT PIPE

(75) Inventors: Masaaki Yamamoto; Jun Niekawa; Yuichi Kimura; Kenichi Namba, all of Tokyo (JP)

(73) Assignee: The Furukawa Electric Co. Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/769,505

(22) Filed: Dec. 18, 1996

(30) Foreign Application Priority Data

| Dec. 21, 1995 | (JP) | 7-332867 |
| Mar. 25, 1996 | (JP) | 8-068080 |
| May 21, 1996 | (JP) | 8-125170 |
| Nov. 8, 1996 | (JP) | 8-312980 |

(51) Int. Cl.$^7$ ............................................. F28D 15/00
(52) U.S. Cl. ............................. 165/104.26; 165/104.21
(58) Field of Search ..................... 165/104.26, 104.33, 165/104.21, 104.14, 46

(56) References Cited

U.S. PATENT DOCUMENTS

| 3,576,210 A | * | 4/1971 | Trent .................... | 165/104.26 |
| 3,735,806 A | * | 5/1973 | Kirkpatrick ......... | 165/104.26 X |
| 3,777,811 A | * | 12/1973 | Shcosinger ......... | 165/104.26 X |
| 3,779,310 A | * | 12/1973 | Russell ................ | 165/104.26 |
| 3,820,596 A | * | 6/1974 | Weinhardt et al. ..... | 165/104.26 |
| 3,853,112 A | * | 12/1974 | Lazaridis et al. ... | 165/104.26 X |
| 3,934,643 A | * | 1/1976 | Laing ................. | 165/104.26 X |
| 3,971,435 A | | 7/1976 | Peck | |
| 4,046,190 A | * | 9/1977 | Marcus et al. ......... | 165/104.26 |
| 4,231,423 A | | 11/1980 | Haslett | |
| 4,602,679 A | | 7/1986 | Edelstein et al. | |
| 4,753,154 A | * | 6/1988 | Higashi ............. | 165/104.26 X |
| 4,880,053 A | * | 11/1989 | Sheyman ............... | 165/104.26 |

(List continued on next page.)

FOREIGN PATENT DOCUMENTS

| EP | 0682223 | | 11/1995 | |
| GB | 1402509 | * | 8/1975 | 165/104.26 |
| JP | 0024369 | * | 2/1977 | 165/104.26 |
| JP | 0083587 | * | 4/1988 | 165/104.26 |
| JP | 304384 | | 11/1993 | |
| SU | 559099 | * | 5/1977 | 165/104.26 |
| SU | 0937962 | * | 6/1982 | 165/104.26 |
| SU | 1002800 | * | 3/1983 | 165/104.26 |
| SU | 1108324 | * | 8/1984 | 165/104.26 |
| SU | 1341487 | * | 9/1987 | 165/104.26 |

Primary Examiner—Christopher Atkinson
(74) Attorney, Agent, or Firm—Thorp Reed & Armstrong, LLP

(57) ABSTRACT

A flat type heat pipe for mounting a heating power element, which is capable of forming an optionally shaped heat transferring path with high accuracy, which is of a thin type and to which fins are easily attached. The flat type heat pipe includes at least two aluminum plates substantially in parallel with each other and brazed to each other so as to form a heat transferring path therebetween. The flat type heat pipe also includes an operating liquid which fills the heat transferring path. Because the heat transferring path 25 is formed by means of press molding, punching, laser beam machining, or cutting various shapes of heat transferring paths can be formed finely and with high accuracy. The flexible flat type heat pipe can be made thin, which allows for a variety of uses. Grooves and wicks can be disposed in the heat transferring path, thereby improving the heat conductivity. Because the surface is flat, the fins can be easily attached thereto, thereby a satisfactory radiation effect can be obtained.

2 Claims, 15 Drawing Sheets

U.S. PATENT DOCUMENTS

| | | | | |
|---|---|---|---|---|
| 4,899,812 A | * | 2/1990 | Altoz | 165/46 X |
| 4,941,530 A | * | 7/1990 | Crowe | 165/104.33 |
| 4,944,344 A | * | 7/1990 | Crowe | 165/104.33 |
| 5,179,500 A | * | 1/1993 | Koubek et al. | 165/104.14 X |
| 5,309,986 A | * | 5/1994 | Itoh | 165/104.26 |
| 5,346,000 A | * | 9/1994 | Schlitt | 165/104.26 |
| 5,427,174 A | * | 6/1995 | Lomolino, Sr. et al. | 165/104.26 X |
| 5,642,776 A | * | 7/1997 | Meyer, IV et al. | 165/46 X |
| 5,671,804 A | * | 9/1997 | Kordelin | 165/46 |

* cited by examiner

FIG. 5A
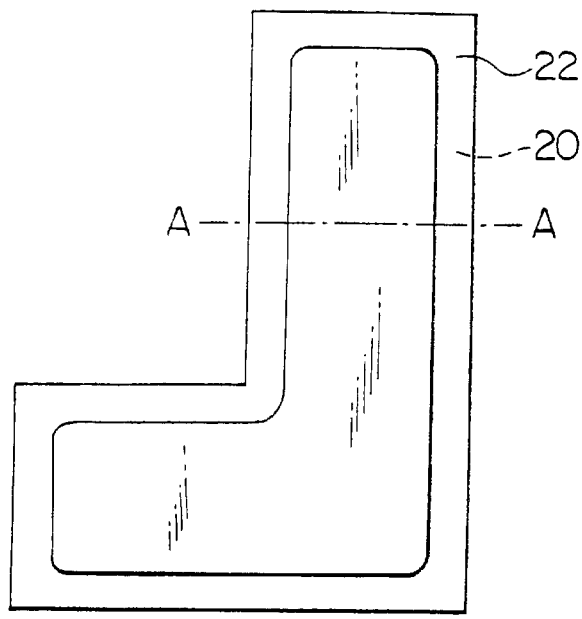
FIG. 5B
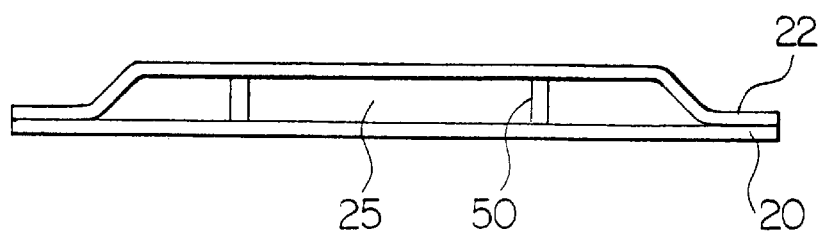
FIG. 5C      FIG. 5D
   
FIG. 5E      FIG. 5F
   

FIG. 8A
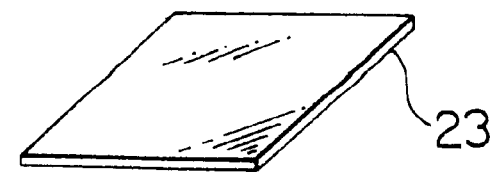
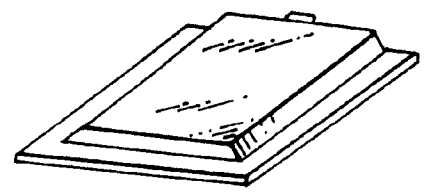
FIG. 8B
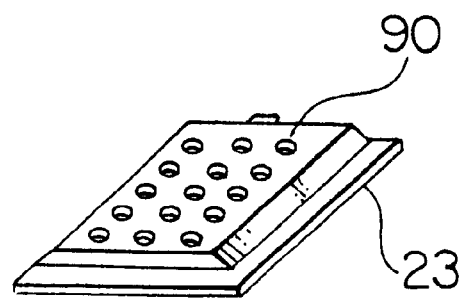
FIG. 8C
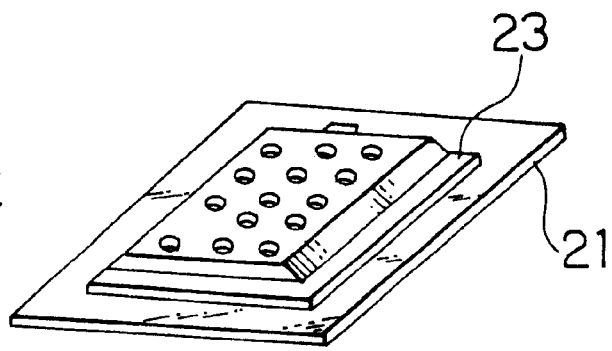

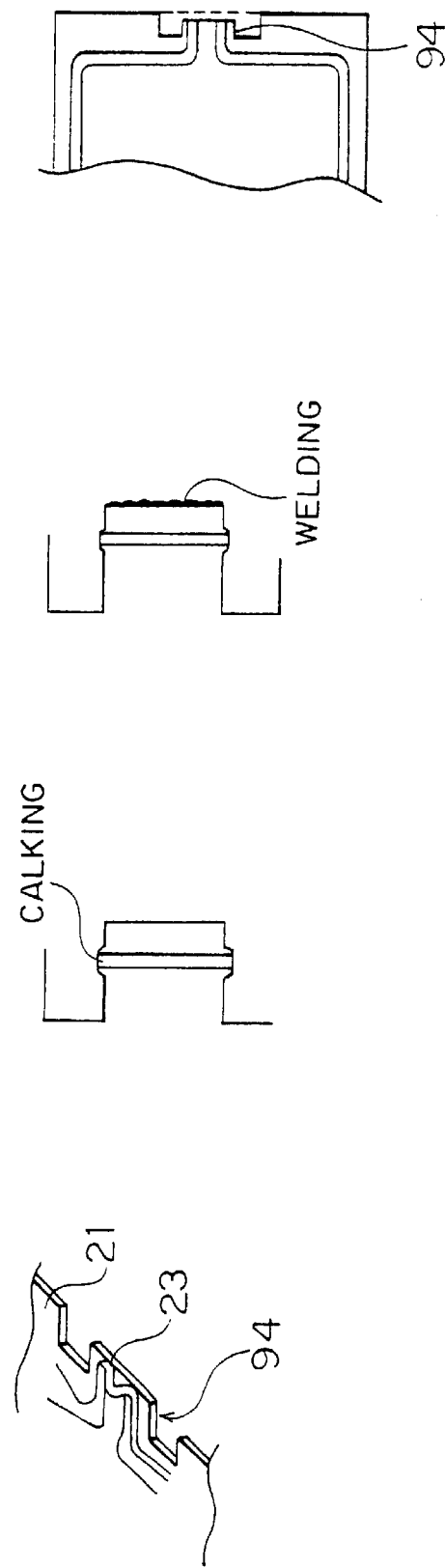

FLAT TYPE HEAT PIPE

FIELD OF THE INVENTION

The present invention relates to a flat type heat pipe which is small-sized, easy to produce, superior in heat conductivity, and adapted to cool heat generating electronic components such as Insulated Gate Bipolar Transistor (IGBT), Intelligent Power Module (IPM), power elements (transistor) of thyristors, or rectifying devices.

BACKGROUND AND DESCRIPTION OF THE RELATED ART

It is known to use roll bond panels as effective cooling means of electronic components relating to power electronics which are used for electronic equipment and power electric equipment.

The above-mentioned roll bond panels, as shown in FIGS. 23a and 23b, are produced by thermo-pressure-bonding and includes two aluminum plates 80, 81 and a release agent therebetween at a portion which forms a heat transferring path 25 wherein a portion of the release agent is inflated by air pressure. The roll bond panel is shaped in such a manner that a portion of the heat transferring path 25 protrudes, so that a surface of the roll bond panel is made concavoconvex.

The roll bond panel has the following problems:

(1) Because it is formed by inflating the portion of the heat transferring path 25 by air pressure, the dimensional accuracy of the heat transferring path 25 cannot be improved. Also, it is difficult to make the heat transferring path 25 thinner.

(2) Because the aluminum plates 80, 81 are thermo-pressure-bonded, grooves (narrow grooves) or wicks cannot be disposed thereon, thus the high heat conductivity cannot be obtained.

(3) Because the surfaces of the aluminum plates 80, 81 are concavoconvex, it is difficult to attach fins which are useful for improving the radioactivity to the surface of the aluminum plates.

It is therefore an object of the present invention to provide a flat type heat pipe, which has an optionally contoured heat transferring path with high accuracy, which is thin, which provides grooves and wicks, and which structure facilitates the attachment of the fins.

SUMMARY OF THE INVENTION

A first embodiment of the present invention provides a flat type heat pipe characterized in that at least two aluminum plates arranged substantially in parallel with each other are brazed to each other so as to form a heat transferring path therebetween, and an operating liquid is filled in the heat transferring path.

A second embodiment of the present invention provides a flat type heat pipe wherein an aluminum plate which is worked in a corrugated manner is interposed between two aluminum plates.

A third embodiment of the present invention provides a flat type heat pipe wherein the aluminum plate which is worked in the corrugated manner is an aluminum brazing sheet.

A fourth embodiment of the present invention provides a flat type heat pipe wherein penetrating holes are disposed on side walls of the aluminum plate which is worked in the corrugated manner.

A fifth embodiment of the present invention provides a flat type heat pipe wherein a metal tube is brazed onto an open end of the heat transferring path and a predetermined portion of aid metal tube is sealed by pressure bonding and/or welding.

A sixth embodiment of the present invention provides a flat type heat pipe wherein supporting bodies are arranged between the at least two aluminum plates which are substantially in parallel with each other, in such a manner that the aluminum plates are spaced at a predetermined distance.

A seventh embodiment of the present invention provides a flat type heat pipe wherein a predetermined number of protruding portions are formed on one aluminum plate of the at least two aluminum plates arranged substantially in parallel with each other and leading portions of the protruding portions are joined to the other aluminum plates.

An eighth embodiment of the present invention provides a flat type heat pipe wherein grooves are formed on inner surfaces of the heat transferring path, and/or a wick is arranged on the heat transferring path.

A ninth embodiment of the present invention provides a flat type heat pipe wherein the wick comprises grooves forms on an inner surface of the aluminum plate, or an uneven portion formed by melting a brazing filler material forms the inner surface of the aluminum plate, whereby the brazing filler material is solidified and forms the inner surface of the aluminum plate.

A tenth embodiment of the present invention provides a flat type heat pipe wherein the wick comprises a wave-like plate brazed onto the aluminum plate, a cylindrical wire netting, a plate-like wire netting, or a number of spheres adjacent to each other.

An eleventh embodiment of the present invention provides a flat type heat pipe wherein protruding portions are formed on one aluminum plate of the at least two aluminum plates arranged substantially in parallel with each other, hole portions are disposed on the other aluminum of the same, and the aluminum plates are positioned by inserting the protruding portions into the hole portions.

A twelfth embodiment of the present invention provides a flat type heat pipe wherein fins are brazed onto a part or the whole of the surface of the aluminum plate.

Further objects and advantages of the invention will be apparent from the following description of the preferred embodiments of the invention as illustrated in the accompanying drawings.

BRIEF DESCRIPTION OF THE DRAWINGS

FIG. 2b is a perspective view of a corrugated brazing sheet used in the above flat type heat pipe shown in FIG. 2a.

FIG. 5a is a plan view of a flat type heat pipe according to a fifth embodiment of the present invention, FIG. 5b is a sectional view taken along line A—A of FIG. 5a, FIG. 5c through 5f are perspective views of a supporting body used in the flat type heat pipe, wherein the supporting body takes the shape of a column, a barrel, a tabor and a sphere, respectively.

FIG. 6b is a sectional view taken along line B—B of FIG. 6a.

FIG. 7b is a transverse sectional view of FIG. 7a.

FIG. 8 is an exploded view showing an example of a method of producing a flat type heat pipe according to the present invention.

FIG. 12b is a side view of FIG. 12a, and FIG. 12c is a front view of FIG. 12a.

FIGS. 14, 14a, 14c and 14d illustrate an example of a method of pouring an operating liquid into the flat type heat pipe of the present invention, then sealing the flat type heat pipe.

FIG. 23b is a sectional view taken along line C—C of FIG. 23a.

DETAILED DESCRIPTION OF THE PREFERRED EMBODIMENTS

Figure 1:
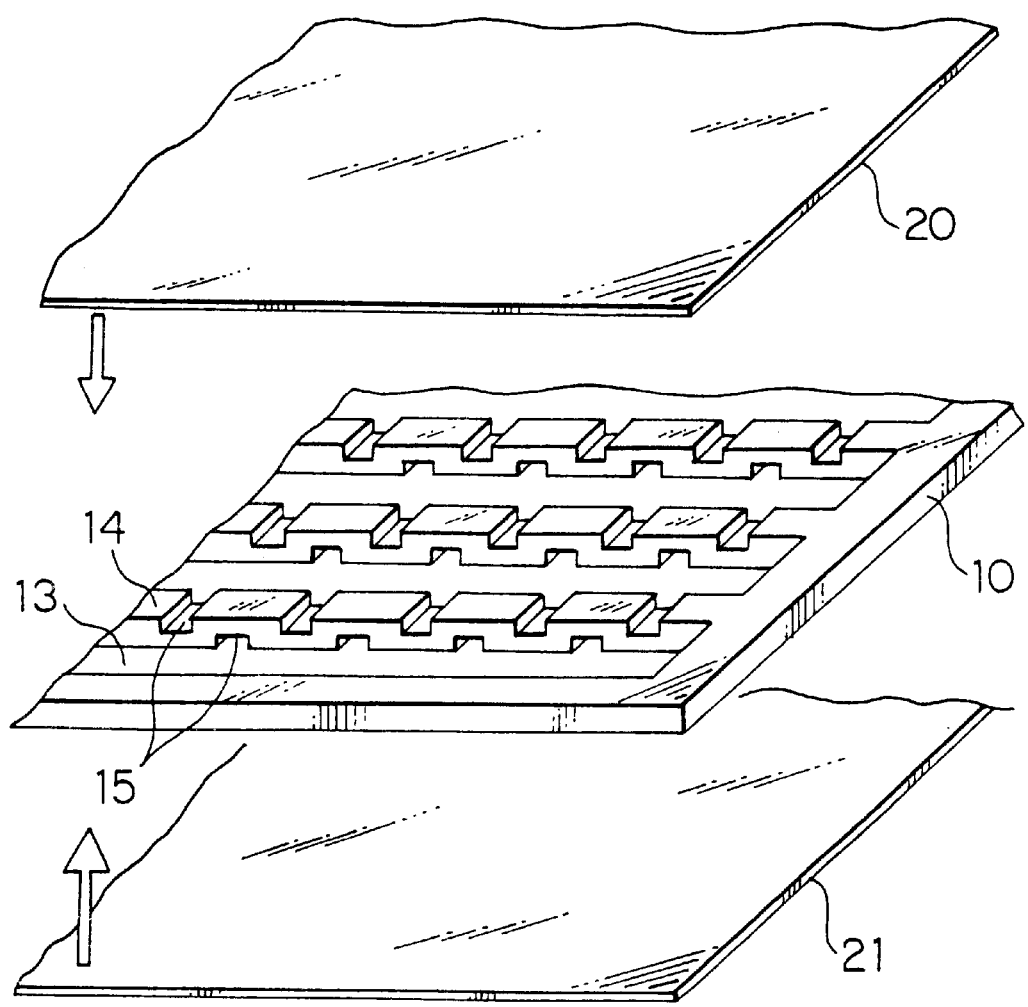
FIG. 1 is an exploded view showing a flat type heat pipe according to a first embodiment of the present invention.

A flat type heat pipe according to the present invention has characteristics of two aluminum plates arranged substantially in parallel with each other and being brazed to each other so as to form a heat transferring path therebetween, and an operating liquid being filled in the heat transferring path.

According to the present invention, there is used, as an aluminum plate, an aluminum plate material having a thickness of for example, 0.2 mm to 5 mm and which exhibits a high thermal conductivity (i.e., the level of JIS-A-1000 where JIS stands for Japanese Industrial Standard) or a brazing plate. Generally, the aluminum plate is used for the outer members, and the brazing plate is used for the inner member.

There can be used, as a brazing plate, a both side-bonding type plate comprised of a core material whose both surfaces are attached to the aluminum plates by brazing using brazing filler metals at both side thereof having a thickness of for example, 0.5 mm to 10 mm. Some examples are, JIS-BA12PC comprising core material 303, brazing filler metal BA4343 [Al-6 to 8wt % Si alloy] JIS-BA22PC comprising core material 6951, brazing filler metal BA4343, and JIS-BA24PC comprising core material 6951, brazing filler metal BA4045 [Al-9 to 11wt % Si alloy]. Also, one side-bonding type plate can be employed as the brazing sheet. If two or more brazing sheets are employed, the bonding strength can be raised if need be. The brazing for bonding is executed at about 600° C.

As for the operating liquid, an ordinal heating medium such as a kind of alcohol, pollution free freon, ice-free liquid, "FLORINATO" (Sumitomo 3M Co.-made fluoro-inert liquid) can be employed.

Even if the flat type heat pipe is arranged horizontally so long as grooves are formed on a wall surface of the portion of the heat transferring path, or wicks are arranged in the heat transferring path, the operating liquid can be made up promptly, thereby improving the heat transfer characteristics. As for the wicks, ordinary articles such as meshes, felts, nonwoven fabrics can be employed.

Because the flat type heat pipe of the present invention is flat at surfaces thereof, fins can be easily attached thereto. If the fins are attached thereto by brazing, the thermal transferring characteristics between the flat type heat pipe main body and the fins are improved, thereby further improving the radiation effect of the fins.

The molding of a dish-like portion of the aluminum plate and the molding of the brazing sheet are performed by press-molding. If the thickness of the work material is relatively thick, about 1 mm or more, the perforating work on the brazing sheet is performed by press-punching, cutting work, a water jetting cutter or a laser beam working machine, and if the work material is thin, the perforating work on the brazing sheet is performed by an original mechanical cutter or a laser beam working machine.

In the heat transferring path of the present invention flat type heat pipe, the operating liquid is circulated sufficiently to realize a high thermal conductivity if the sectional dimension is preferably set to not less than 0.5 mm×0.5 mm, or not less than the corresponding sectional area preferably.

In the present invention, at least two aluminum plates are joined by the brazing, thereby forming the heat transferring path. If a brazing sheet is used for any one of the aluminum plates, the brazing can be performed easily. The heating for the brazing is performed while sandwiching the brazing sheet between the aluminum plates and adding pressure to such a degree that respective things are not deviated. The heating temperature is chosen according to the types of brazing sheets employed. Generally, the brazing is carried out at a temperature of about 600° C. The heating is carried out by using a heating furnace. In this instance, it is efficient to carry out the brazing of the fins simultaneously with the brazing of the aluminum plates.

In the present invention, an open portion is disposed at least one location of the heat transferring path, such that the operating liquid can be poured through the open portion. If a metal tube made of aluminum or aluminum alloy, is attached to the open portion such that it forms an air tight seal, the operating liquid can be easily poured thereinto and easily sealed after the pouring. Though the sealing is facilitated by pressure bonding or welding, brazing can be also employed. It is preferred that welding is carried out together with the pressure bonding such that sealing is surely accomplished. The kind of operating liquid that is used is suitably changed according to the temperature at which the heat pipe is used.

In the present invention, if grooves are formed on inner surfaces of the heat transferring path, or wicks are arranged in the heat transferring path, the operating liquid can be circulated quickly. According to the present invention, the above-mentioned grooves can be easily formed at the time of rolling or press-molding of the aluminum plate, and the formed grooves cannot be eliminated at subsequent processes. Furthermore, variously shaped wicks can be easily arranged therein.

The present invention provides for the positioning of both of the aluminum plates by inserting the protruding portions on one of the aluminum plates into the hole portions on the other of the aluminum plates such that the dimensional accuracy of the formed flat type heat pipe is improved.

FIG. 1 is an exploded view showing a flat type heat pipe according to a first embodiment of the present invention. A number of slotted holes 13 are formed on a brazing sheet 10 having both surfaces brazed to both aluminum plates 20 and 21 and alternately, recesses 15 crossing a bridge 14 formed on a right surface and a rear surface of the bridge 14. Aluminum plates 20, 21 are superposed on a right surface and a rear surface of the brazing sheet 10, respectively, and then they are heated to a predetermined temperature, thereby brazing the aluminum plates 20 and 21 and the brazing sheet 10 together as one body.

This brazing sheet 10 can be formed by forming recesses 15 first, then working the slotted holes 13 by punching. Alternatively, the slotted holes 13 and the recesses 15 of the bridge 14 can also be formed by one pressing step.

The characteristics of the flat type heat pipe are described below:

(1) Because the upper and lower aluminum plates are brazed perfectly by the brazing sheet of the both side-bonding type, the aluminum plates can bear high internal pressure.

(2) Because each of the recesses is formed in a widthwise direction of the bridge, the operating liquid is continuously flowed in the plane direction through the slotted holes 13 and the recesses 15.

(3) Because each of the recesses is formed in a widthwise direction of the bridge, there is no need to superpose a number of aluminum plates, three aluminum plates suffice.

Figure 2A:
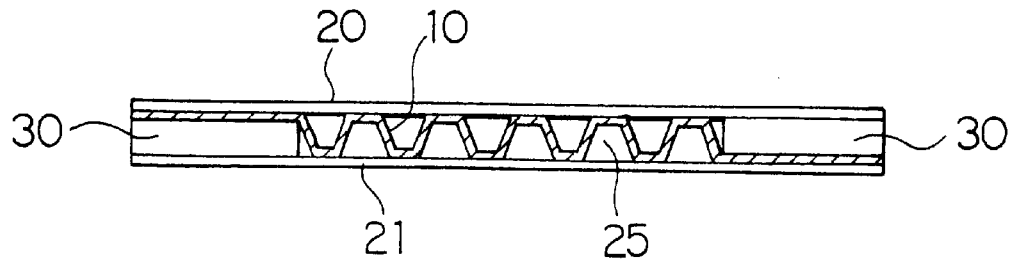
FIG. 2a is a transverse sectional view of a flat type heat pipe according to a second embodiment of the present invention.

FIG. 2a is a transverse sectional view of a flat type heat pipe according to a second embodiment of the present invention. In this flat type heat pipe, aluminum plates 20, 21 are arranged on upper and lower surfaces of the brazing sheet 10 which are corrugated in a trapezoidal sectional shape. Punched work 30 are brazed to both side end portions of the aluminum plates 20, 21 for reinforcement. End portions of the brazing sheet 10 are interposed between the punched work 30 and the aluminum plates 20, 21.

Figure 2B:
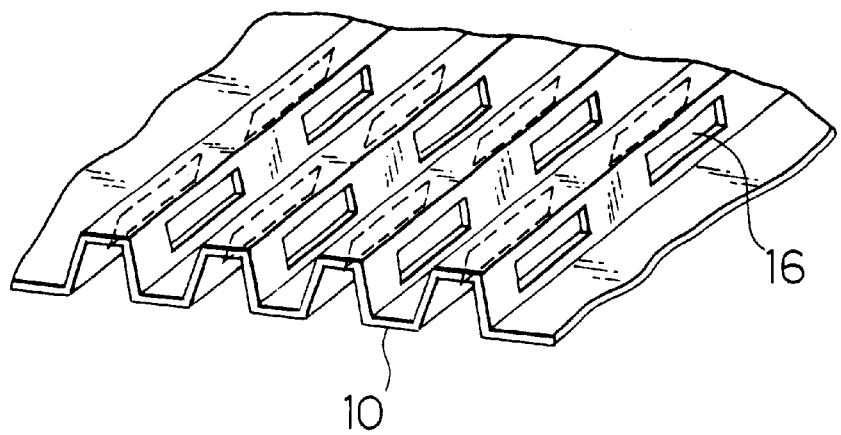

FIG. 2b is a perspective view of the above brazing sheet 10. A number of windows 16 are disposed on side surfaces of trapezoidal portions of the brazing sheet 10. In the flat type heat pipe to which the brazing sheet 10 shown in FIG. 2b is applied, heat transferring paths 25 each are continued in the plane direction.

The brazing sheet 10 is formed by arranging windows 16 on the brazing sheet 10, then working the brazing sheet 10 in a corrugated sectional shape.

Figure 3:
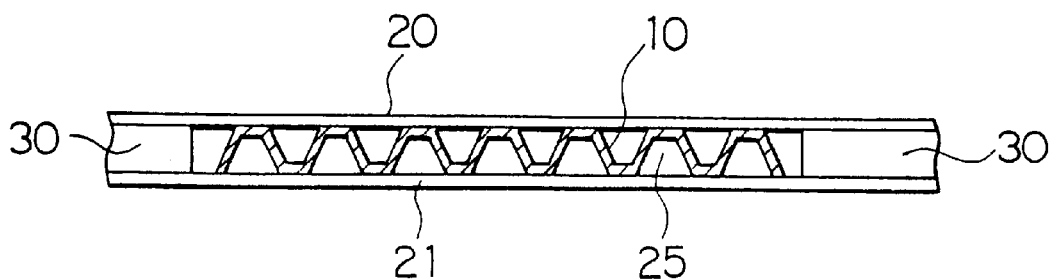
FIG. 3 is a sectional view of a flat type heat pipe according to a third embodiment of the present invention.

FIG. 3 is a sectional view of a flat type heat pipe according to a third embodiment of the present invention.

In this flat type heat pipe, the punched work 30 is directly brazed to the aluminum plates 20, 21 without interposing both end portions of the corrugated brazing sheet 10 between the punched work 30 and the aluminum plates 20, 21. The brazing sheet 10 is directly brazed to the aluminum plates 20, 21 independent of the punched work 30.

Figure 4A:
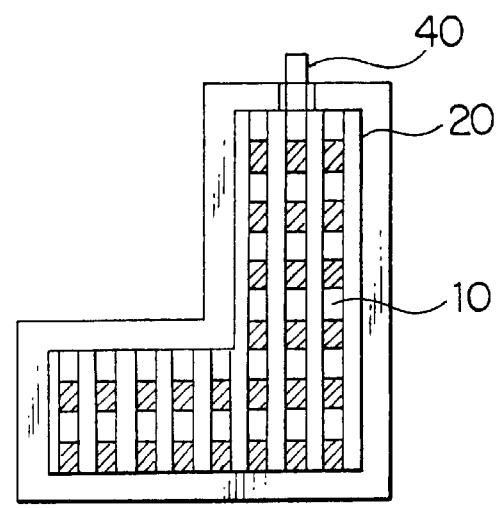
FIG. 4a is plan view of a flat type heat pipe according to a fourth embodiment of the present invention.
Figure 4B:
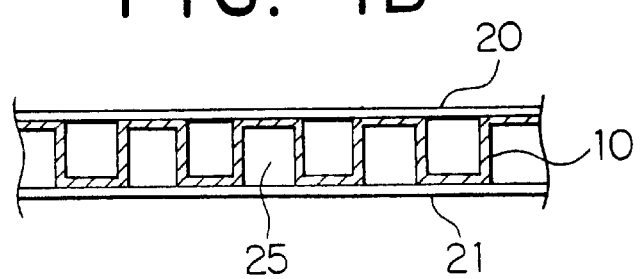
FIG. 4b is a transverse sectional view of FIG. 4a, and FIG. 4c is a perspective view of a brazing sheet for forming a path used in the flat type heat pipe.

FIG. 4a is a plan view of a flat type heat pipe according to a fourth embodiment of the present invention, and FIG. 4b is a transverse sectional view of FIG. 4a.

In this flat type heat pipe, the aluminum plates 20, 21 are arranged on upper and lower surfaces of the brazing sheet 10 which is corrugated in a rectangular sectional shape at predetermined portions thereof.

In FIG. 4a, reference numeral 40 designates an aluminum tube for pouring the operating liquid into the heat transferring path.

Figure 4C:
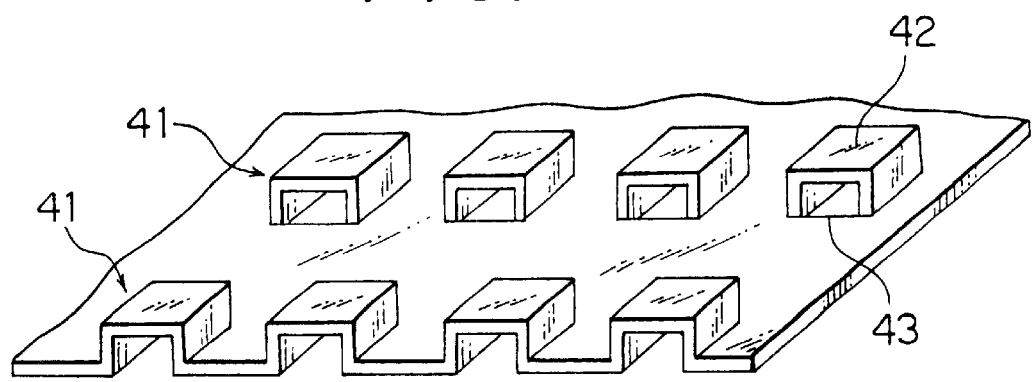

FIG. 4c is a perspective view of the brazing sheet 10. A plurality of rectangular sectional shaped members are positioned at regular intervals to form row 41. Both ends of each protrusion portion 42 which constitute the row 41 are left open. Accordingly, in the flat type heat pipe, the heat transferring path 25 are formed continuously in the plane direction.

The brazing sheet 10 is formed by notching the brazing sheet 10 at end portions 43 of the protrusion portion 42 and then causing the protruding portions 42 to protrude.

FIG. 5a is a plan view of a flat type heat pipe according to a fifth embodiment of the present invention, and FIG. 5b is a sectional view taken along line A—A of FIG. 5a.

The flat type heat pipe comprises an aluminum plate 22 formed in a dish-like manner and the aluminum plate 20 which is flat, both aluminum plates 20 and 22 are superposed, and brazed at circumferential portions thereof, thereby ensuring a space 25 which is a heat transferring path at a center portion thereof. The supporting body 50 is brazed to the desired portion of the plates 20, 22 which corresponds to the space which will bear the inner pressure when used. The supporting body 50 is provided according to the situation.

FIGS. 5c, 5d, 5e and 5f are perspective views of embodiments of the supporting body 50. FIG. 5c is a cylindrical supporting body. FIG. 5d is a barrel-like supporting body. FIG. 5e is a drum-like supporting body. FIG. 5f is a spherical supporting body.

Figure 6A:
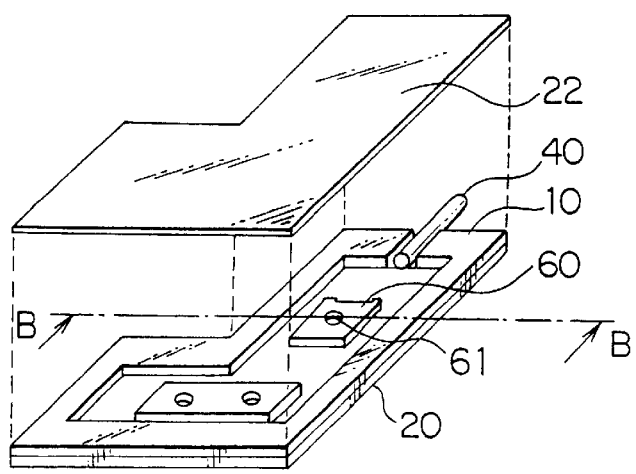
FIG. 6a is an exploded view showing a flat type heat pipe according to a sixth embodiment of the present invention.

FIG. 6a is an exploded view showing a flat type heat pipe according to a sixth embodiment of the present invention. The brazing sheet 10 is punched in an L-shape at a center portion thereof and is arranged on the aluminum plate 20. An inner frame 60 made of a brazing sheet is brazed to the desired portion inside the punched portion so as to bear the inner pressure when used.

Figure 6B:
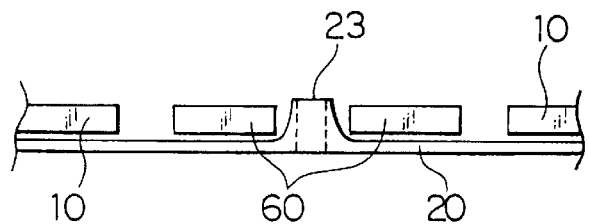

FIG. 6b is a sectional view taken along line B—B of FIG. 6a. The hole 61 defined by the center portion of the inner frame 60 is fitted into a burring-worked hole portion 23 disposed on the aluminum plate 20, thereby positioning the inner frame 60. The inner frame 60 may be positioned by inserting the inner frame 60 into a recess disposed on an inner surface of aluminum plate 20.

The flat type heat pipe is formed by arranging the aluminum plate 22 on the brazing sheet 10 and the inner frame 60 and then heating them to a brazing temperature.

The upper surface of the burring-worked hole portion 23 and an inner surface of the aluminum plate 22 are brazed to produce an air-tight connection using a wire-like brazing material.

The heat transferring path is formed between the brazing sheet 10 and the inner frame 60 of the brazing sheet. This heat transferring path is formed continuously in the plane direction. In FIG. 6a, reference numeral 40 designates an aluminum tube for pouring the operating liquid into the heat transferring path.

Figure 7A:
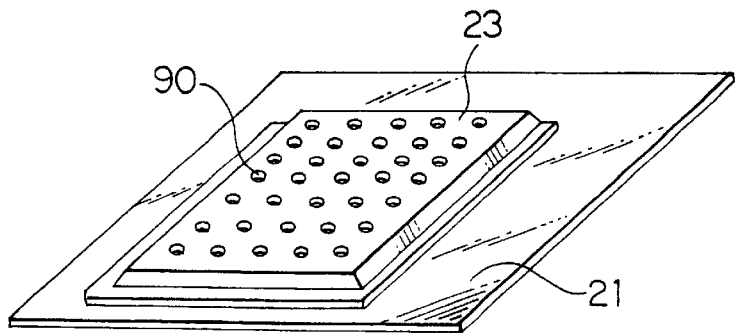
FIG. 7a is a perspective view of a flat type heat pipe according to a seventh embodiment of the present invention.
Figure 7B:
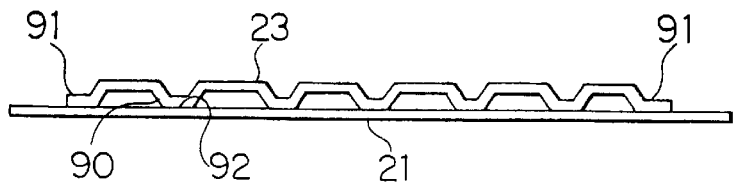

FIG. 7a is a perspective view of a flat type heat pipe according to a seventh embodiment of the present invention, and FIG. 7b is a sectional view of FIG. 7a.

In this flat type heat pipe, a number of truncated conical protruding portions 90 are formed at regular distances along one aluminum plate 23 of the two aluminum plates arranged substantially in parallel with each other. Leading ends of the truncated conical protruding portions 90 are brazed to the other aluminum plate 21 thereof. The aluminum plate 21 is a brazing plate having a brazing material at one surface side thereof, and arranged with the brazing material side faced upward. A circumferential portion 91 and leading portions 92 of the protrusion portions of the aluminum plate 23 are brazed to the aluminum plate 21.

This flat type heat pipe is superior in its ability to withstand inner pressure strength. This embodiment differs from the embodiment of FIG. 5, because the supporting body 50 of FIG. 5 is not used. Both the aluminum plates 21, 23 are easily joined to each other. Furthermore, a surface of the aluminum plate 23 on a side in which the protrusion portions are formed is also a substantially flat shape, so that the high heat conductive efficiency can be obtained no matter how the heating generating element is connected to the aluminum plates 21, 23.

The contour and the number of the protrusion portions can be selected according to the use. If a number of protrusion portions of small diameter are formed, the strength of the aluminum plate 23 is improved, and the thermal conductivity is equalized. The contour of the protrusion portion can be an elliptic cylinder-like column, a square pillar, an elliptical cone-like cone, a sexangle cone-like structure or a rectangular cone-like structure.

There is shown in FIG. 8 an example of a seventh embodiment of a method of producing a flat type heat pipe according to the present invention. As shown in FIG. 8a, one aluminum plate 23 of the two aluminum plates is press-molded in a dish-like contour, next desired portions of the protruded dish-like portion is depressed to form cones in the opposite side which results in truncated conical protrusion portions 90 being formed. Furthermore, the aluminum plate 23 is mounted on the other aluminum plate 21 with the truncated conical protrusion portions 90 faced downward as shown in FIG. 8c, and then heated in a furnace at a predetermined temperature, thereby both the aluminum plates 21, 23 are brazed to each other. On this occasion, the depth of aluminum plate 23 at the dish portion and the height of the protruding portion 90 are made the same. The other aluminum plate 21 is employed with a brazing plate having a brazing material at one side surface thereof, and is arranged with the brazing material side upward.

Press-molding of the dish-like portion may be executed simultaneously with that of the protruding portions.

Figure 9:
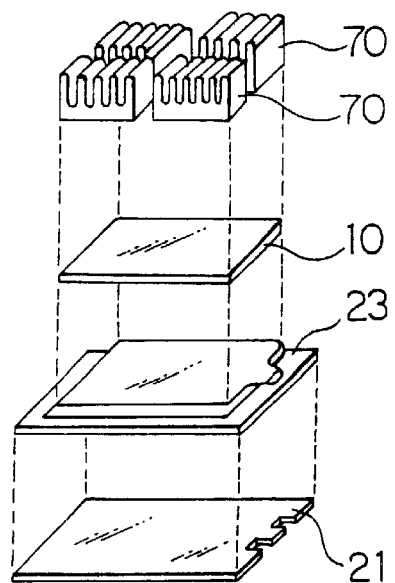
FIG. 9 is an exploded view showing an example of another method of producing the flat type heat pipe according to the present invention.

FIG. 9 illustrates a method of executing the simultaneous brazing of the flat type heat pipe of the present invention and the radiating fins.

The aluminum plate 21 with a brazing plate having a brazing material at one side surface thereof is arranged at the lowest location with the brazing material side upward. The dish-like aluminum plate 23 having protruding portions is arranged on the aluminum plate 21 with the protruding portions faced downward, on which the brazing sheet 10 having the brazing materials at both side surfaces is arranged. Furthermore, four block-like fins 70 are arranged on the blazing sheet 10. This assembly is heated in a brazing furnace. In this situation, if flux is previously coated on the brazing materials of the brazing plates 21, 10, the joined strength is improved.

Figure 10:
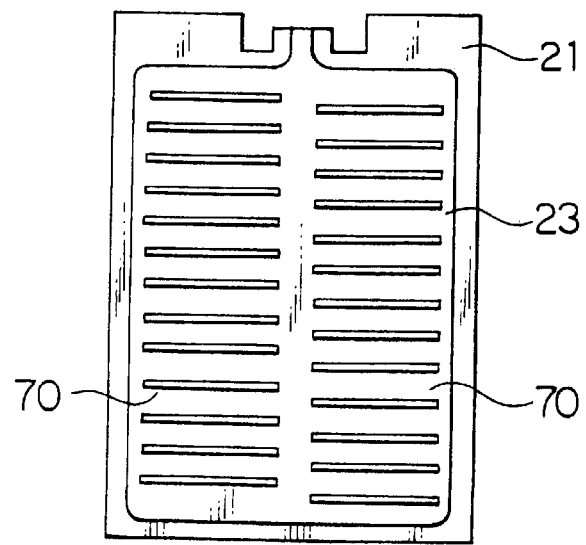
FIG. 10 is a plan view showing an embodiment in which fins are arranged on the flat type heat pipe according to the present invention.

As shown in FIG. 10, if the right fins 70 and the left fins 70 which are positioned adjacent to each other are arranged in such a manner that the right peak portions and the left peak portions are shifted alternately, the thermal conductivity is improved.

If the flat type heat pipe with the fins is merely placed on MCM (Multi-chip module), the MCM can be satisfactorily cooled. In a case where the flat type heat pipe is placed on the MCM, the flat type heat pipe is arranged with the fins faced upward.

Figure 11:
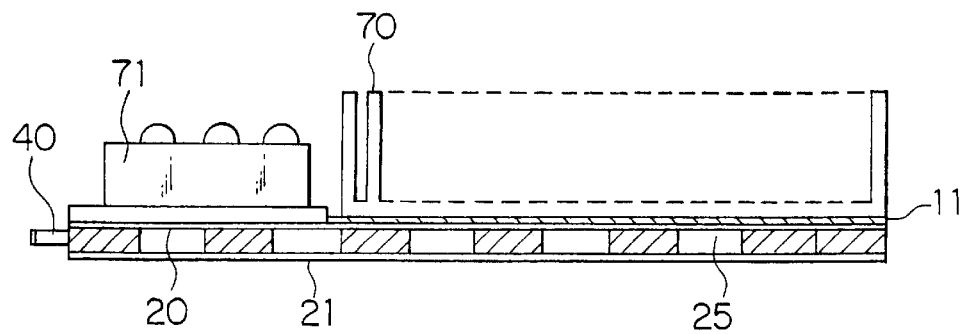
FIG. 11 is a plan view showing a flat type heat pipe according to an eighth embodiment of the present invention.

FIG. 11 is a plan view showing a flat type heat pipe according to an eighth embodiment of the present invention.

In this flat type heat pipe, the fins 70 are brazed to one side surface of the flat type heat pipe main body shown in FIG. 1 by the brazing sheet 11, whereas the heat generating electronic component 71 is brazed to the other side surface of the flat type heat pipe. In FIG. 11, reference numeral 40 designates an aluminum tube for pouring the operating liquid into the heat transferring path.

It is efficient to braze the fins together with the flat type heat pipe when forming the flat type heat pipe by the brazing. Because the flat type heat pipe main body and the fins are metallically joined to each other due to the brazing of the fins, the thermal conductivity between both is improved compared with a thermal conductive resin coating method in the prior art. This results in an improvement of the radiation effect of the fins.

Figure 12A:
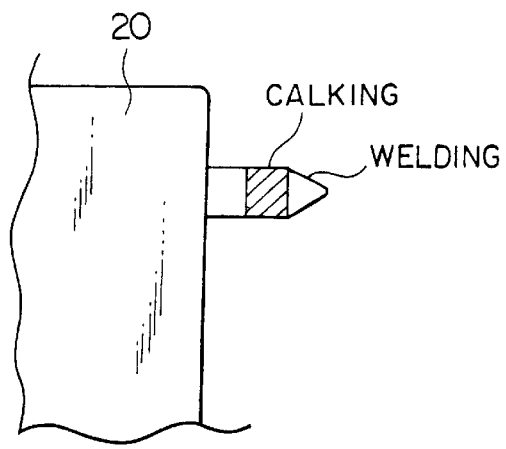
FIG. 12a is a plan view showing an example of a portion through which operating liquid fills on the flat type heat pipe according to the present invention.
Figure 12B:
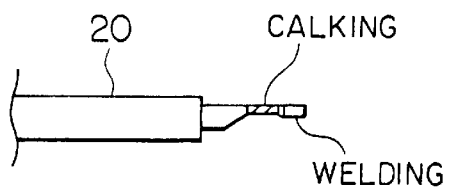
Figure 12C:
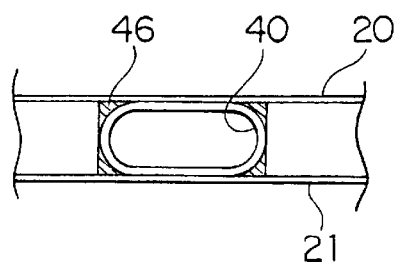

FIG. 12a shows a plan view of an example of an operating liquid filling portion on the flat type heat pipe according to the present invention. FIG. 12b a side view of FIG. 12a and FIG. 12c is a front view of FIG. 12a.

An aluminum tube 40 is inserted into an open portion of the heat transferring path of the flat type heat pipe and the aluminum tube 40 is air-tightly brazed to the circumferential surface of the open portion using a brazing filler material 46. The aluminum tube 40 is friction-fitted at a predetermined portion of the open portion and sealed at a leading portion of the open portion by the welding.

Figure 13A:
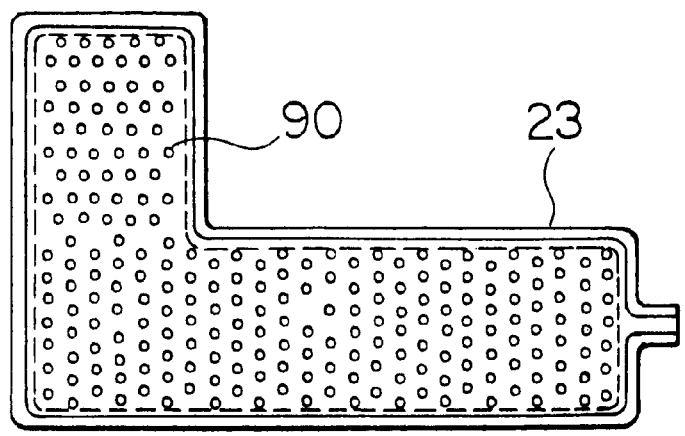
FIG. 13a is a plan view showing an example of a method of producing the flat type heat pipe according to the present invention.
Figure 13B:
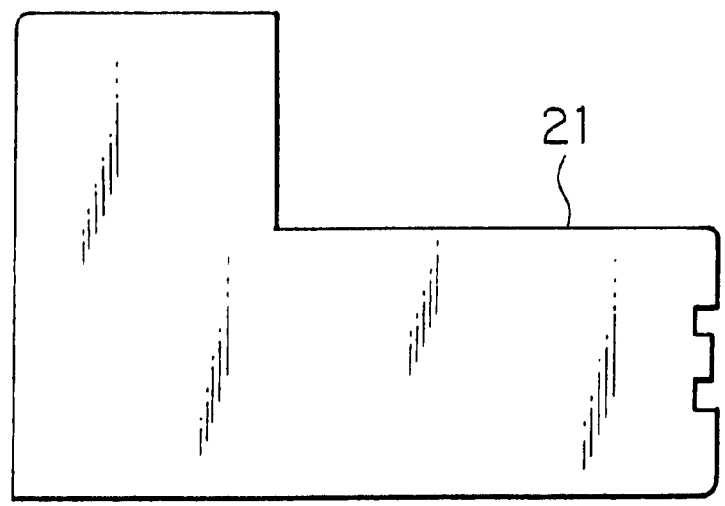
FIG. 13b is a plan view showing another example of the method of producing the flat type heat pipe of the present invention.
Figure 15:
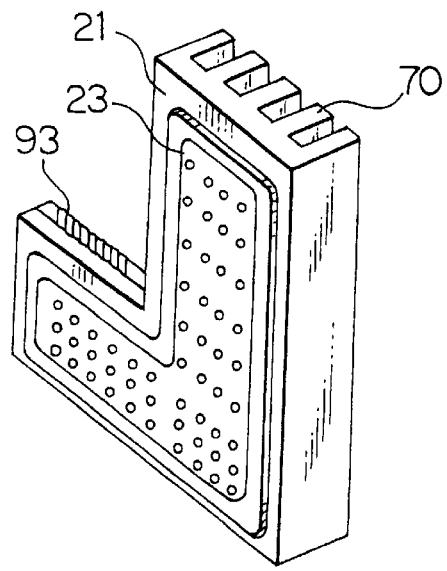
FIG. 15 is a perspective view of a flat type heat pipe according to a ninth embodiment of the present invention.

FIG. 13 through FIG. 15 show examples of a method of producing the flat type heat pipe according to the present invention. The flat type heat pipe is formed by using the two aluminum plates 21, 23 shown in FIGS. 13a and 13b. In this situation, as shown in FIG. 9, the fins are brazed to the flat type heat pipe simultaneously.

The aluminum plate 23 in FIG. 13a is a dish-like molded plate having truncated conical protruding portions 90, and the aluminum plate 21 in FIG. 13b is a brazing plate having a brazing filler material at one side thereof.

FIGS. 14a, 14b, 14c and 14d show a method of pouring and sealing the operating liquid.

An open end 94 is protrudingly disposed as shown in FIG. 14a. The operating liquid is poured through the protruding open end 94, then an intermediate portion of the protruding open end 94 is caulked from above and below as shown in FIG. 14b. Further the lead end is welded to create a sealed, as shown in FIG. 14c. TIG welding, plasma welding, and laser beam welding are suitable welding methods. As shown in FIG. 14d, the lead end of the protruding open end 94 is positioned slightly inside the outer circumference of the heat pipe. In this manner, the fear that the protruding open end 94 may be damaged due to the outer forces after sealed is reduced thus, the reliability is improved.

In the flat type heat pipe, because both sides of the protruding open end 94 are free, the aluminum is forced out freely and laterally when the friction-fitting is carried out vertically, thereby putting the friction-fitting into practice with certainty.

FIG. 15 is a perspective view of a flat type heat pipe with fins, which is produced by the above-mentioned method, according to a ninth embodiment of the present invention. The flat type heat pipe which is produced is located upright as shown in FIG. 15 and a predetermined portion thereof is heated by a heater 93 and the heat resistance is measured. The heat resistance of the flat type heat pipe with fins is two-thirds of that of the aluminum casing brazed with the radiating fins having the same dimension/counter as the flat type heat pipe.

Next, an example of the constituent groove and the wick will be described below. FIG. 16 illustrates examples of the constituent groove, and FIG. 17 illustrates examples of the wick arrangement.

Figure 16A:
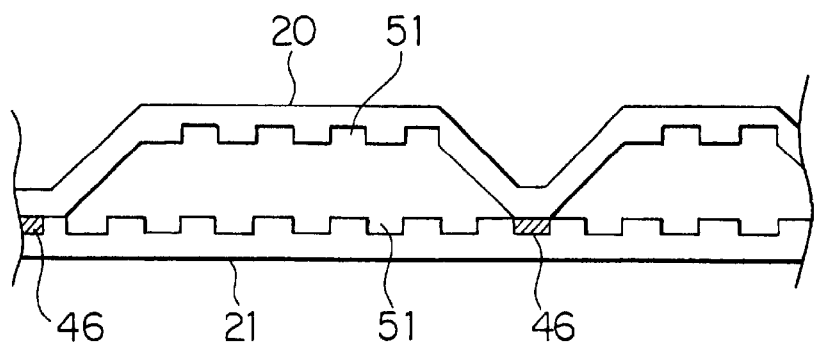
FIGS. 16a and 16b are perspective views of flat type heat pipes according to the tenth and eleventh embodiments of the present invention, respectively.
Figure 16B:
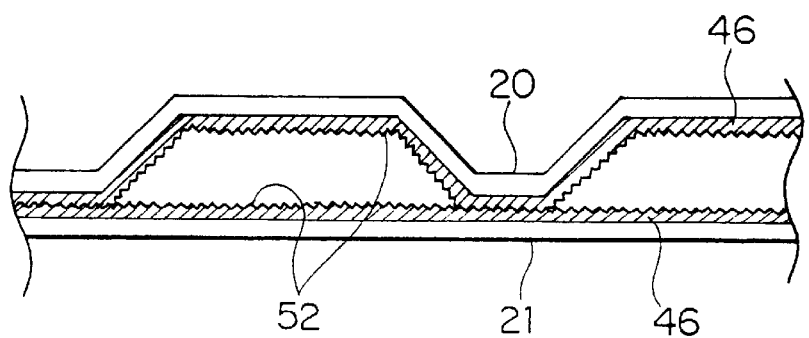

FIGS. 16a and 16b show a flat type heat pipes according to the tenth and eleventh embodiments of the present invention, respectively. These embodiments comprise the flat type heat pipe having grooves.

In the flat type heat pipe shown in FIG. 16a, grooves 51 are formed on an inner surfaces of the two aluminum plates 20, 21. These grooves 51 can be formed by an etching method or a mold pressing method. The operating liquid can flow freely along these grooves 51. The aluminum plates 20, 21 are joined by brazing filler materials 46.

In the flat type heat pipe shown in FIG. 16b, inner surfaces of the two aluminum plates 20, 21 are made of brazing filler material 46. Initially, the surfaces of the brazing filler material 46 is molten and then they solidified; thus, the surfaces are made rough in an uneven manner. This uneven portion 52 formed on the above-mentioned surface constitutes grooves. This uneven portion 52 is formed when the brazing is executed on the two aluminum plates 20, 21. The shape of the uneven portion 52 depends on the thickness of the brazing filler material and the brazing temperature. The thicker the brazing filler material and the higher the brazing temperature, the deeper the uneven portion.

Figure 17A:
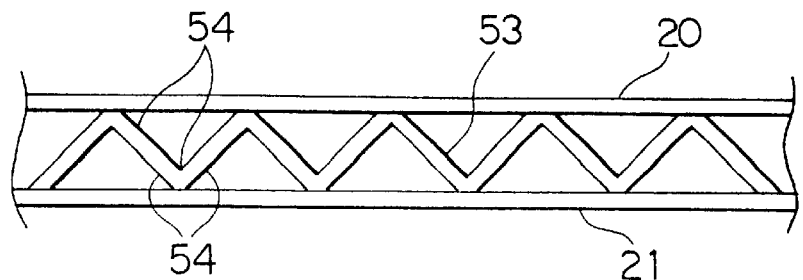
FIGS. 17a through 17d are sectional views of the flat type heat pipes according to the twelfth, thirteenth, fourteenth, and fifteenth embodiments of the present invention, respectively.

FIG. 17a shows a flat type heat pipe according to a twelfth embodiment of the present invention. In this embodiment, a wave-like plate 53 is arranged as the wick between the two aluminum plates 20, 21, wherein the wave-like plate 53 is brazed to the two aluminum plates 20, 21. The vicinity 54 of a joined portion of the aluminum plates 20, 21 and the wave-like plate 53 constitute cooling medium passages.

Figure 17B:
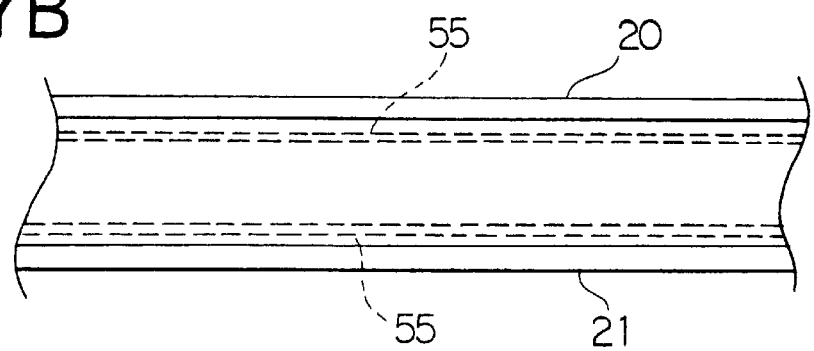

FIG. 17b shows a flat type heat pipe according to a thirteenth embodiment of the present invention. In this embodiment, a plurality of plate-like metal nets 55 are arranged as the wick between the two aluminum plates 20, 21. The wick may also take the form of a single wire net.

Figure 17C:
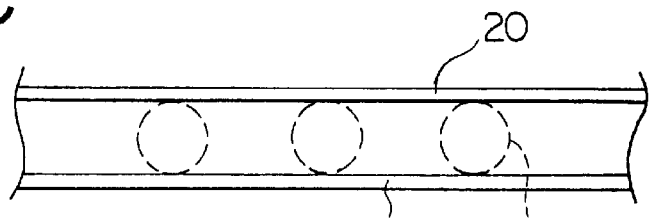

FIG. 17c shows a flat type heat pipe according to a fourteenth embodiment of the present invention. In this embodiment, cylindrical metal nets 56 are arranged as the wick between the two aluminum plates 20, 21.

Figure 17D:
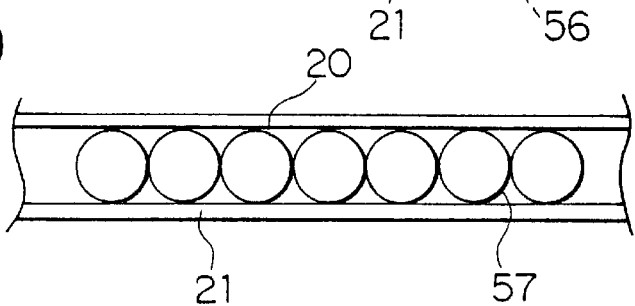

FIG. 17d shows a flat type heat pipe according to a fifteenth embodiment of the present invention. In this embodiment, a number of spheres 57 are arranged between the two aluminum plates 20, 21 so as to be adjacent to one another.

Figure 18:
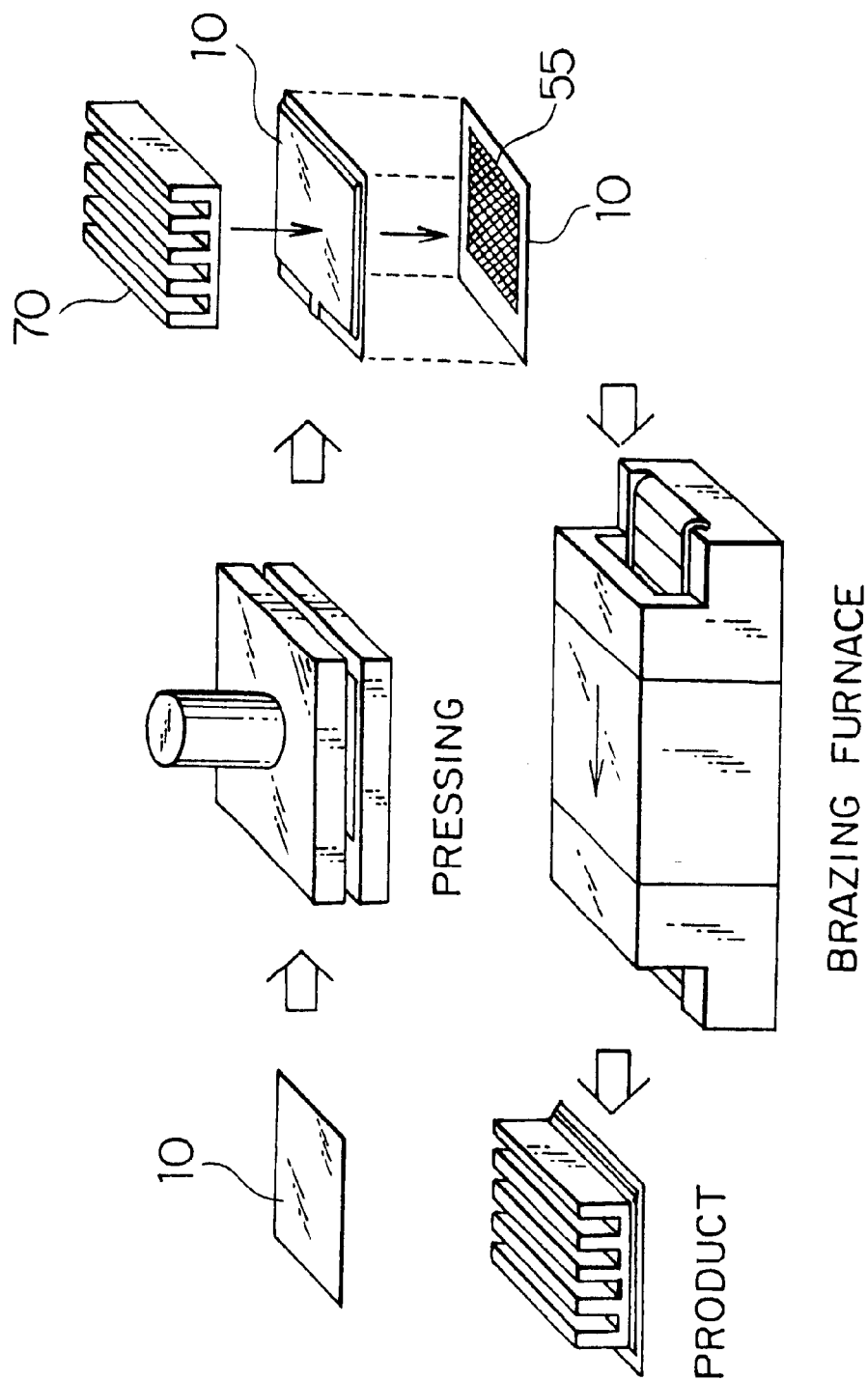
FIG. 18 shows an exploded view of the process of producing the flat type heat pipe of the thirteenth embodiment of the present invention.

FIG. 18 shows a method of producing the flat type heat pipe shown in FIG. 17b, which is provided with fins. A blank plate of the brazing plate is pressed into a predetermined contour and then placed on a plate-like wire netting 55. Furthermore fins 70 are placed on the pressed blazing plate 10. This assembly is passed through the brazing furnace to be made into a brazed article. Then the operating liquid is entered into the flat type heat pipe thus, the vacuum lock is carried out.

The heat resistance of the flat type heat pipe having grooves or wicks inside and fins attached to the outside and produced by the method of the present invention was measured similarly to that of FIG. 15. According to the measurement, the heat resistance is reduced by 10 to 20% compared to the flat type heat pipe without grooves and wicks.

FIGS. 19 through 22 show flat type heat pipes according to the sixteenth and seventeenth embodiments of the present invention. These embodiments each comprise two aluminum plates. Protrusion portions are disposed on one of the aluminum plates, and holes are disposed on the other of the aluminum plates, thereby the aluminum plates are joined by inserting the protrusion portions into the holes.

Figure 19:
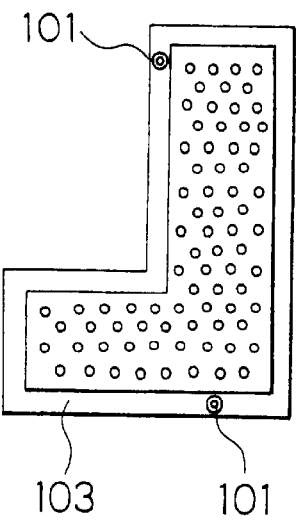
FIG. 19 is a plan view showing a flat type heat pipe according to the sixteenth and seventeenth embodiments of the present invention.

FIG. 19 is a plan view of the flat type heat pipe having the protrusion portions and the holes. The flat type heat pipe is L-shaped and two positioning portions 101 are provided.

Figure 20:
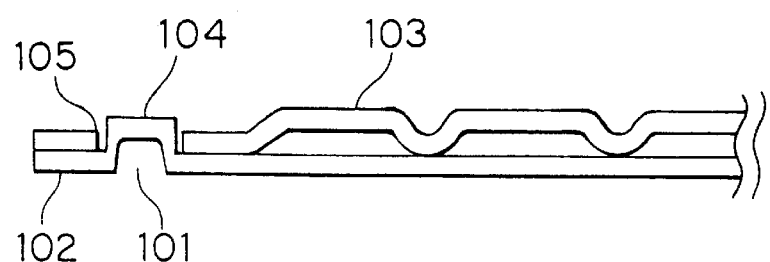
FIG. 20 is a sectional view showing the flat type heat pipe according to the sixteenth embodiment of the present invention.

FIG. 20 shows a sectional view of one example of the positioning portions. The flat type heat pipe is comprised of two aluminum plates 102, 103. The protruding portions 104 are disposed on the lower aluminum plate 102, and hole portions 105 are defined by the upper aluminum plate 103. The upper and lower aluminum plates 102, 103 are joined by inserting the protruding portions 104 into the hole portions 105. If the clearance between the protruding portion 104 and the hole portion 105 is small, the dimensional accuracy can be improved.

Figure 21:
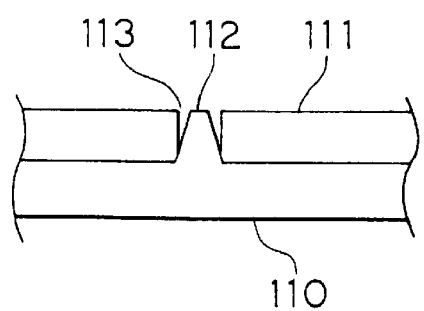
FIG. 21 is a sectional view showing the flat type heat pipe according to the seventeenth embodiment of the present invention.

FIG. 21 shows a sectional view of another example of the positioning portion. In this example, protruding portions 112 of the lower aluminum plates 110 are tapered and holes 113 of the upper aluminum plates 111 are relatively small. The protruding portion 112 is adapted to fit into the hole 113, which results in an improvement of the positioning accuracy.

Figure 22:
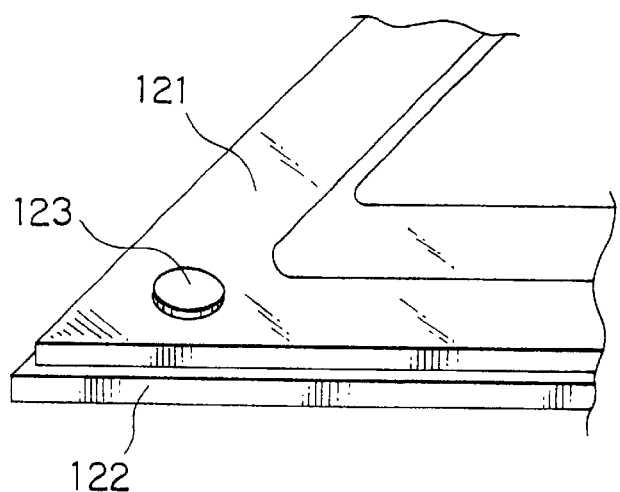
FIG. 22 is a perspective view showing the flat type heat pipe according to the sixteenth and seventeenth embodiments of the present invention.
Figure 23A:
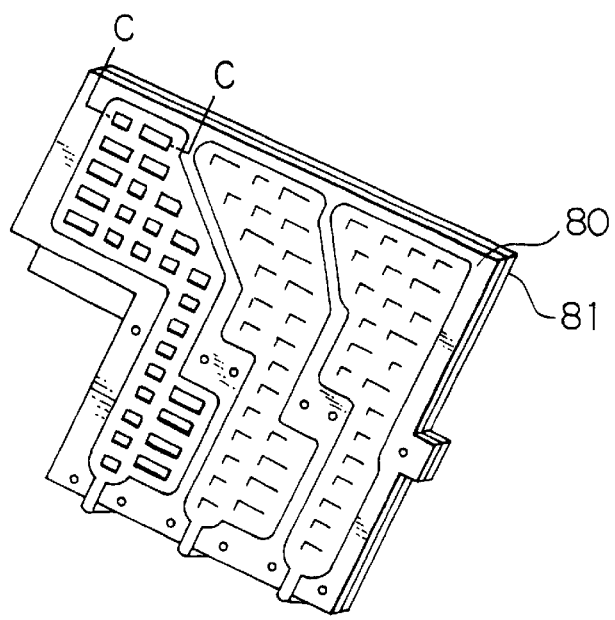
FIG. 23a is a perspective view of a flat type heat pipe found in the prior art.
Figure 23B:
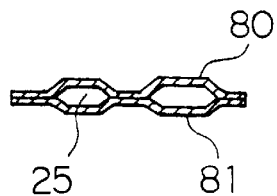

FIG. 22 shows a perspective view of the example of the positioning portion. In this example, the outer dimension of the upper aluminum plate 121 is smaller by about 0.1 mm to 0.5 mm compared with that of the lower aluminum plate 122. The positioning is carried out by the positioning portion 123. Therefore, even if there is a slight deviation in the positioning, the dimensional accuracy of the flat type heat pipe is improved without deviating from the outside dimension of the lower aluminum plate 122. So, even in a case where the flat type heat pipe is automatically mounted onto the power element, by means of screws in the robot, the dimensional accuracy is improved. Thus, the position of the female screw is hard to be deviated.

Moreover, the positioning by the protruding portion and the hole portion may be carried out at one location or a plurality of locations as need be. Furthermore, the protruding portion and the hole portion may be disposed on the upper aluminum plate, and the corresponding hole portions and protruding portions may be disposed on the lower aluminum plate.

In a case where the flat type heat pipe is formed by using three or more of aluminum plates and brazing sheets, (e.g., the protruding portions are disposed on one aluminum plate, and the hole portions are formed on two of the other aluminum plates) three or more of the aluminum plates and the brazing plates can be positioned by penetrating the protruding portions through the hole portions. Also, the corresponding protruding portions and hole portions may be disposed on the aluminum plate or brazing plate adjacent to one another, respectively.

As described above, because the flat type heat pipe of the present invention is formed by methods such as press-molding, punching, laser beam working and cutting variously shaped heat transferring path can be formed minutely and with high accuracy. Furthermore, the thin and flexible flat type heat pipe can be obtained and the range of uses can be increased. Because the grooves and the wicks can be disposed in the heat transferring path, the thermal conductivity can be improved. Furthermore, because the surface of the pipe is flat, the fins can be easily provided within the heat transferring path and satisfactory radiation effect can be obtained. The hole portions and the protruding portions can be provided thereon for positioning the aluminum plates and the dimensional accuracy can be improved.

Accordingly, the remarkable industrial effect can be attained.

Many different embodiments of the invention may be constructed without departing from the spirit and scope of the invention. It should be understood that the invention is not limited to the specific embodiments described in the specification, except as defined in the appended claims.

What is claimed is:

1. A flat type heat pipe, comprising:

(a) two aluminum plates arranged substantially parallel to each other;

(b) a corrugated aluminum plate interposed between said two aluminum plates, said corrugated aluminum plate having a plurality of corrugations of trapezoidal sectional shape comprising flat portions and slanted surfaces, said slanted surfaces having rectangular windows disposed thereon, and said flat portions of said corrugated aluminum plate being brazed to each of said two aluminum plates, thus form a heat transferring circuit;

(c) a wick being arranged on said heat transferring circuit; and (d) a working liquid being sealed in said heat transferring circuit; said flat type heat pipe being enabled to be placed horizontally.

2. The flat type heat pipe of claim 1, wherein said corrugated aluminum plate is an aluminum brazing sheet.

* * * * *